US010784836B2

(12) United States Patent
Kaida et al.

(10) Patent No.: US 10,784,836 B2
(45) Date of Patent: Sep. 22, 2020

(54) PIEZOELECTRIC VIBRATION DEVICE AND METHOD FOR MANUFACTURING THE SAME

(71) Applicant: Murata Manufacturing Co., Ltd., Nagaokakyo-shi, Kyoto-fu (JP)

(72) Inventors: Hiroaki Kaida, Nagaokakyo (JP); Keiichi Kami, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 683 days.

(21) Appl. No.: 15/677,413

(22) Filed: Aug. 15, 2017

(65) Prior Publication Data

US 2017/0373664 A1 Dec. 28, 2017

Related U.S. Application Data

(63) Continuation of application No. PCT/JP2016/050563, filed on Jan. 8, 2016.

(30) Foreign Application Priority Data

Feb. 18, 2015 (JP) ................................. 2015-029657

(51) Int. Cl.
*H01L 41/09* (2006.01)
*H01L 41/22* (2013.01)
(Continued)

(52) U.S. Cl.
CPC ............... *H03H 9/10* (2013.01); *H01L 41/23* (2013.01); *H01L 41/29* (2013.01); *H01L 41/31* (2013.01);
(Continued)

(58) Field of Classification Search
CPC ........ H03H 9/02842; H03H 3/02; H03H 3/10; H03H 9/0211; H03H 9/02228;
(Continued)

(56) References Cited

U.S. PATENT DOCUMENTS

2011/0221535 A1 9/2011 Sakaba et al.
2011/0234329 A1* 9/2011 Fukuda ................ H03H 9/1021
331/156

(Continued)

FOREIGN PATENT DOCUMENTS

JP 2007-258948 A 10/2007
JP 2012-147497 A 8/2012

(Continued)

OTHER PUBLICATIONS

International Search Report issued in International Application No. PCT/JP2016/050563, dated Mar. 15, 2016.
(Continued)

*Primary Examiner* — Thomas M Dougherty
(74) *Attorney, Agent, or Firm* — Arent Fox LLP

(57) ABSTRACT

A piezoelectric vibration device that includes a piezoelectric vibrator having excitation electrodes formed thereon; a base having the piezoelectric vibrator on a first surface thereof; outer electrodes formed to continuously extend from the first surface of the base through a side face of the base to a second surface of the base opposite the first surface; and a lid having a recess opening that faces the first surface of the base, the lid being joined to the base to hermetically seal the piezoelectric vibrator in an internal space defined by the recess and the base. An edge portion of a corresponding one of the outer electrodes, formed by the first surface and the side face of the base, is at least partly covered by a covering member having insulating properties.

13 Claims, 10 Drawing Sheets

(51) Int. Cl.
*H03H 9/10* (2006.01)
*H03H 3/02* (2006.01)
*H01L 41/23* (2013.01)
*H01L 41/29* (2013.01)
*H01L 41/31* (2013.01)
*H03H 9/13* (2006.01)
*H03H 9/19* (2006.01)

(52) U.S. Cl.
CPC ............ *H03H 3/02* (2013.01); *H03H 9/1021* (2013.01); *H03H 9/13* (2013.01); *H03H 9/19* (2013.01); *H03H 2003/022* (2013.01)

(58) Field of Classification Search
CPC .............. H03H 9/175; H03H 2003/025; H01L 41/047; H01L 41/29
USPC .......................... 310/340, 344, 348; 29/25.35
See application file for complete search history.

(56) References Cited

U.S. PATENT DOCUMENTS

| 2017/0366161 | A1* | 12/2017 | Kawai | H03H 3/02 |
| 2018/0226943 | A1* | 8/2018 | Kidu | H01L 41/338 |
| 2018/0248516 | A1* | 8/2018 | Noto | H03B 5/32 |
| 2019/0245504 | A1* | 8/2019 | Yamamoto | H03H 9/02149 |
| 2020/0169244 | A1* | 5/2020 | Teramura | H03H 9/02102 |

FOREIGN PATENT DOCUMENTS

| JP | 2014-030082 A | 2/2014 |
| JP | 2014-204304 A | 10/2014 |

OTHER PUBLICATIONS

Written Opinion of the International Searching Authority issued in International Application No. PCT/JP2016/050563, dated Mar. 15, 2016.

* cited by examiner

FIG. 6
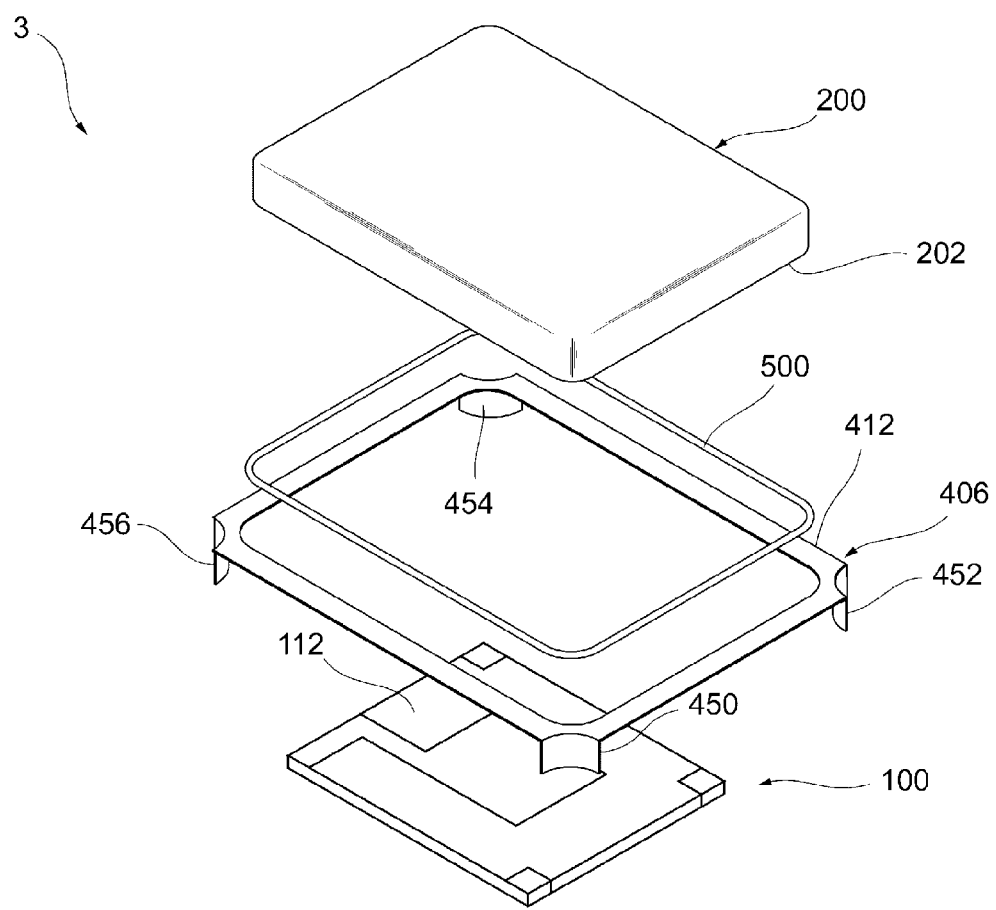
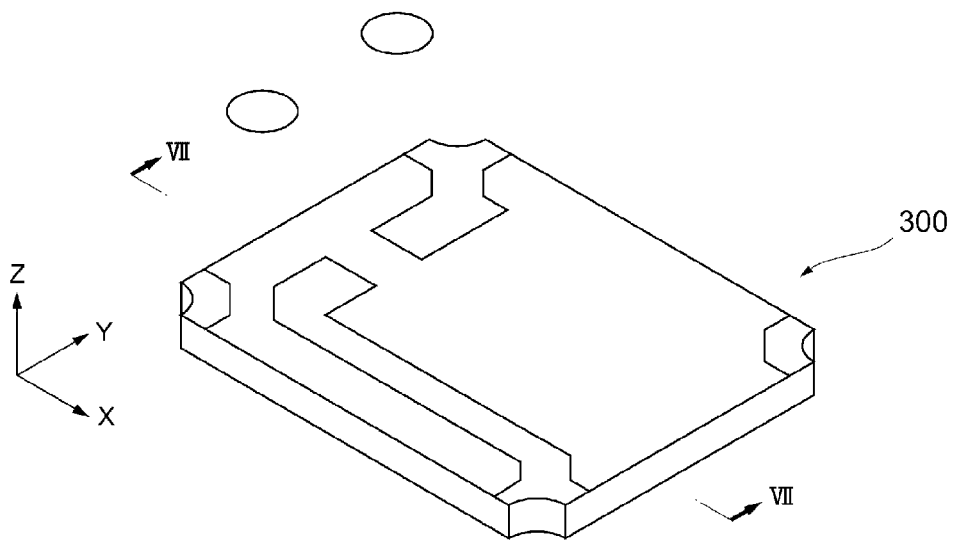

FIG. 8
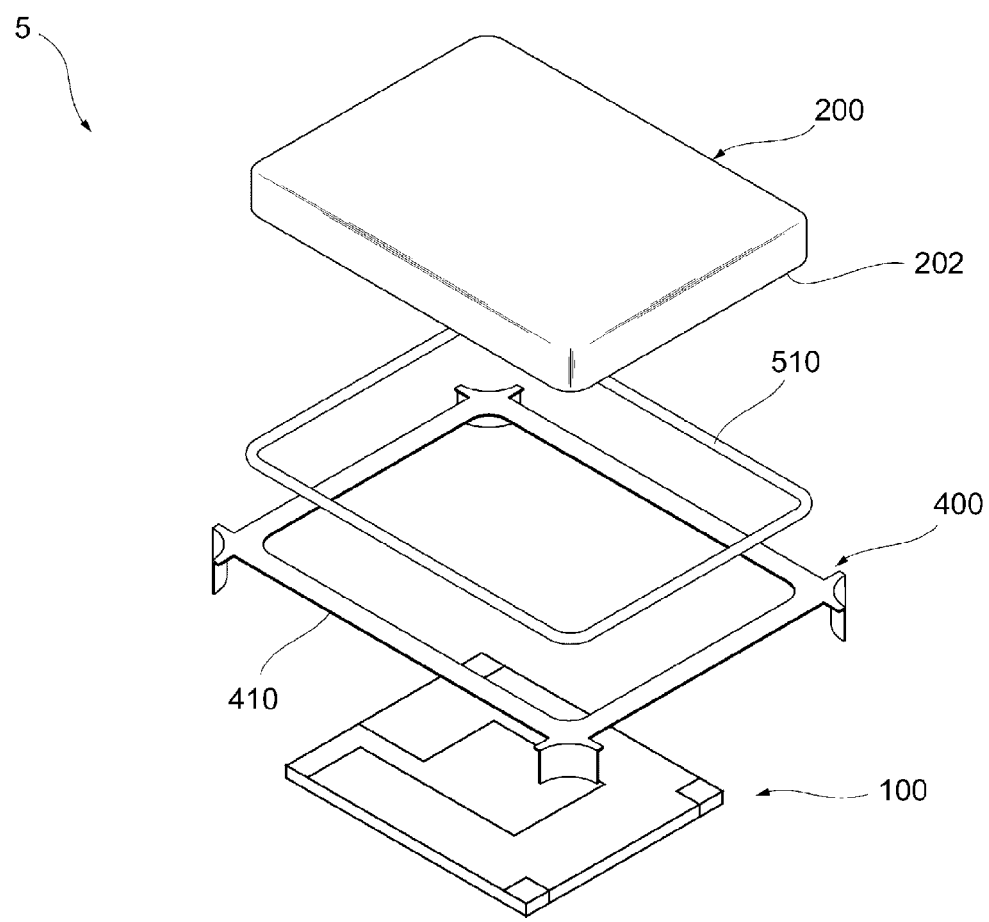
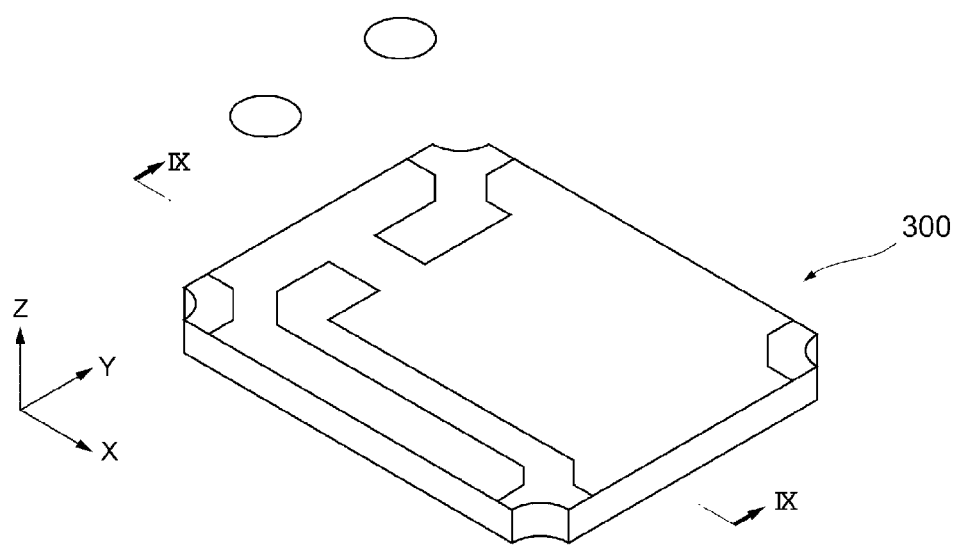

PIEZOELECTRIC VIBRATION DEVICE AND METHOD FOR MANUFACTURING THE SAME

CROSS REFERENCE TO RELATED APPLICATIONS

The present application is a continuation of International application No. PCT/JP2016/050563, filed Jan. 8, 2016, which claims priority to Japanese Patent Application No. 2015-029657, filed Feb. 18, 2015, the entire contents of each of which are incorporated herein by reference.

FIELD OF THE INVENTION

The present invention relates to a piezoelectric vibration device and a method for manufacturing the same.

BACKGROUND OF THE INVENTION

As an example of piezoelectric vibration devices used in oscillators, band-pass filters, and the like, a piezoelectric vibration device is known in which a quartz crystal blank is mounted on a rectangular ceramic substrate and the front and back surfaces of the substrate are electrically connected by through terminals formed on the side face of the ceramic substrate. In this configuration, extended terminals connected to electrodes on the quartz crystal blank are formed on the front surface of the ceramic substrate, and the extended terminals are electrically connected to mounting terminals on the back surface of the substrate (see Patent Document 1).

In the configuration described above, electrodes on the ceramic substrate, such as the extended terminals and the through terminals, extend from the front surface to the side face through an edge of the ceramic substrate. Since the electrodes on the ceramic substrate are exposed to the outside at the edge of the ceramic substrate vulnerable to wear, the electrodes may be damaged and may even be disconnected.

Patent Document 1: Japanese Unexamined Patent Application Publication No. 2014-30082

SUMMARY OF THE INVENTION

The present invention has been made in view of the circumstances described above. An object of the present invention is to prevent disconnection of electrodes and thereby improve reliability of electrical connection.

A piezoelectric vibration device according to an aspect of the present invention includes a piezoelectric vibrator having excitation electrodes formed thereon; a base having a substantially rectangular outer shape and having the piezoelectric vibrator on a first surface thereof; an outer electrode formed to continuously extend from the first surface of the base through a side face of the base to a second surface of the base opposite the first surface; and a lid having a recess opening to face the first surface of the base, the lid being joined to the base to hermetically seal the piezoelectric vibrator in an internal space defined by the recess and the base. An edge portion of the outer electrode, formed by the first surface and the side face of the base, is at least partly covered by a covering member having insulating properties.

In this configuration, the edge portion of the outer electrode, formed by the first surface and the side face of the base, is at least partly covered by the covering member. This reduces exposure of the electrode at the edge portion, prevents disconnection of the electrode, and thus improves reliability of electrical connection.

In the piezoelectric vibration device, the covering member may include a frame-shaped sealing portion disposed on the first surface of the base along an opening edge portion of the recess of the lid, and an extended portion integrally formed with the frame-shaped sealing portion, the extended portion extending from the frame-shaped sealing portion to cover at least part of the edge portion of the outer electrode.

In the piezoelectric vibration device, the lid may be joined to the base, with a sealing member along an opening edge portion of the recess interposed therebetween. The covering member may include a frame-shaped guide portion formed on the first surface of the base to surround the sealing member, and an extended portion integrally formed with the frame-shaped guide portion, the extended portion extending from the frame-shaped guide portion to cover at least part of the edge portion of the outer electrode.

In the piezoelectric vibration device, the covering member may be made of a resin material.

In the piezoelectric vibration device, the covering member may be made of a glass material.

This improves adhesion strength between the covering member and the base.

In the piezoelectric vibration device, the base may have a notched side face formed by cutting part of the side face, and the outer electrode may be formed to continuously extend from the first surface of the base through the notched side face to the second surface of the base. The notched side face may be formed by cutting a corner portion adjacent to two side faces.

In the piezoelectric vibration device, the extended portion may extend along the side face of the base to reach the second surface.

In the piezoelectric vibration device, the extended portion may extend along the side face of the base to reach a position between the first surface and the second surface.

With this configuration, a stepped portion formed by the extended portion serves as a stopper to prevent, for example, solder wicking during a reflow process. When the covering member is made of a resin material or a glass material, the covering member is not wetted by solder and solder wicking is further prevented.

In the piezoelectric vibration device, a plurality of outer electrodes may be provided, and extended portions may be formed to correspond to the respective outer electrodes.

In the piezoelectric vibration device, the entire edge portion of the outer electrode may be covered by the covering member.

In the piezoelectric vibration device, the covering member may include a frame-shaped sealing portion made of glass, the frame-shaped sealing portion being disposed on the first surface of the base along an opening edge portion of the recess of the lid, and an extended portion made of glass and integrally formed with the frame-shaped sealing portion, the extended portion extending from the frame-shaped sealing portion to cover at least part of the edge portion of the outer electrode. The piezoelectric vibration device may further include a sealing member made of resin and disposed on the frame-shaped sealing portion of the covering member. The lid may be joined to the base by the frame-shaped sealing portion made of glass and the sealing member made of resin.

This improves adhesion strength between the covering member and the base.

A method for manufacturing a piezoelectric vibration device according to another aspect of the present invention includes (a) forming a piezoelectric vibrator having excitation electrodes; (b) forming a base having an outer electrode that continuously extends from a first surface of the base through a side face of the base to a second surface of the base opposite the first surface; (c) covering at least part of an edge portion of the outer electrode with a covering member having insulating properties, the edge portion being formed by the first surface and the side face of the base; (d) mounting the piezoelectric vibrator onto the first surface of the base; and (e) joining a lid to the base, the lid having a recess opening to face the first surface of the base, so as to hermetically seal the piezoelectric vibrator in an internal space defined by the recess and the base.

In the configuration described above, the edge portion of the outer electrode, formed by the first surface and the side face of the base, is at least partly covered by the covering member. This reduces exposure of the electrode at the edge portion, prevents disconnection of the electrode, and thus improves reliability of electrical connection.

In the method for manufacturing a piezoelectric vibration device, the covering member may include a frame-shaped sealing portion made of glass and disposed on the first surface of the base along an opening edge portion of the recess of the lid, and an extended portion made of glass and integrally formed with the frame-shaped sealing portion, the extended portion extending from the frame-shaped sealing portion to cover at least part of the edge portion of the outer electrode. The covering member may be subjected to preliminary firing after being placed on the base. In addition, the covering member may be subjected to final firing after the lid is mounted onto the base, with the frame-shaped sealing portion of the covering member interposed therebetween.

In the method for manufacturing a piezoelectric vibration device, the lid may be joined to the base with a sealing member along an opening edge portion of the recess interposed therebetween. The covering member may include a frame-shaped guide portion formed on the first surface of the base to surround the sealing member, and an extended portion integrally formed with the frame-shaped guide portion, the extended portion extending from the frame-shaped guide portion to cover at least part of the edge portion of the outer electrode.

In the method for manufacturing a piezoelectric vibration device, the covering member may include a frame-shaped sealing portion made of glass and disposed on the first surface of the base along an opening edge portion of the recess of the lid, and an extended portion made of glass and integrally formed with the frame-shaped sealing portion, the extended portion extending from the frame-shaped sealing portion to cover at least part of the edge portion of the outer electrode. The covering member may be fired after being placed on the base, and a sealing member of resin may be formed on at least one of the frame-shaped sealing portion of the covering member and an opening edge portion of the recess of the lid, the lid may be mounted onto the base with the frame-shaped sealing portion of the covering member and the sealing member of resin interposed therebetween, and the sealing member of resin may be thermally cured.

The present invention prevents disconnection of electrodes and thereby improves reliability of electrical connection.

BRIEF DESCRIPTION OF THE DRAWINGS

FIG. 6 is an exploded perspective view of a piezoelectric vibration device according to a second embodiment of the present invention.

FIG. 8 is an exploded perspective view of a piezoelectric vibration device according to a third embodiment of the present invention.

DETAILED DESCRIPTION OF THE PREFERRED EMBODIMENTS

Figure 1:
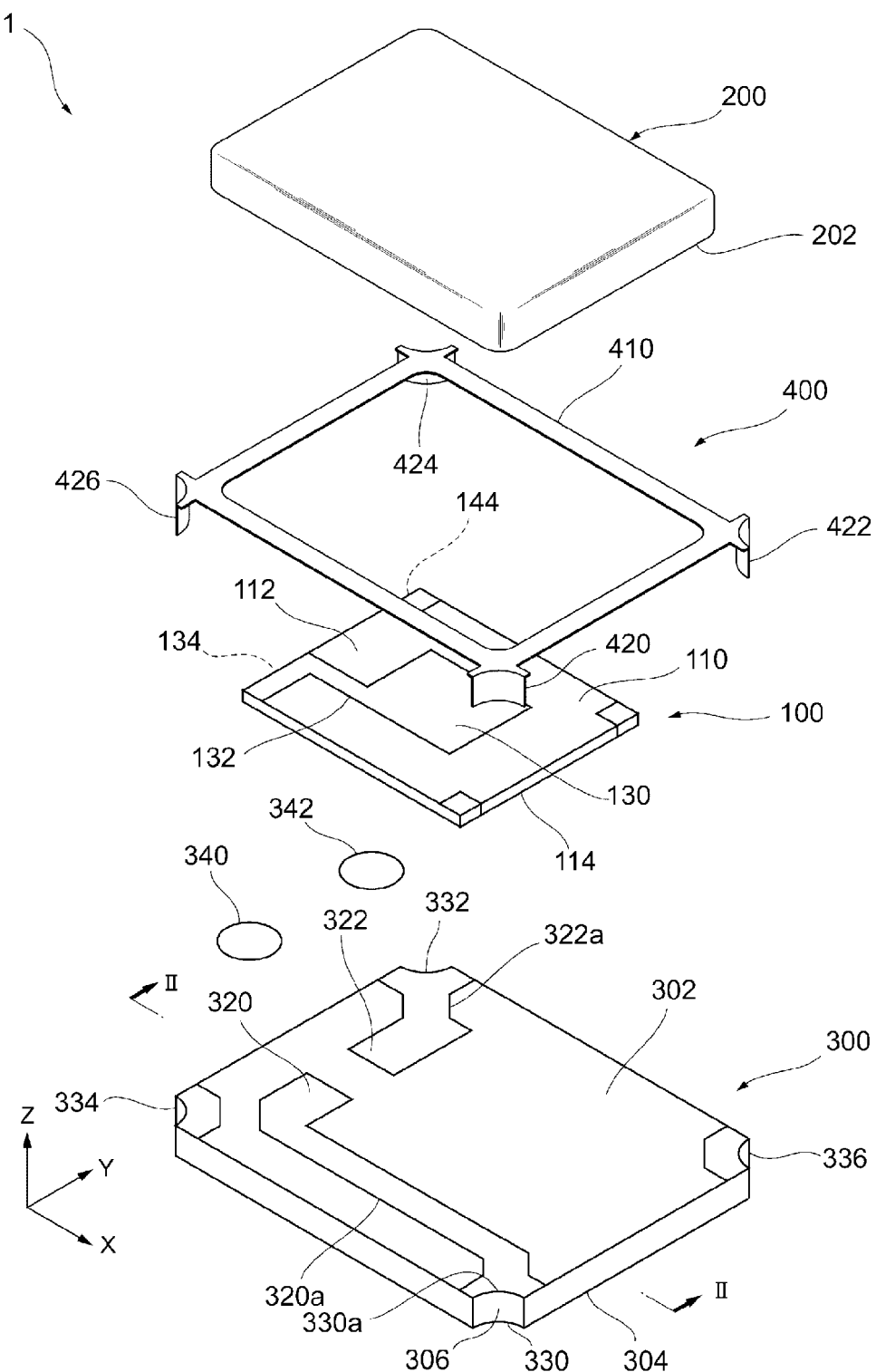
FIG. 1 is an exploded perspective view of a piezoelectric vibration device according to a first embodiment of the present invention.

Embodiments of the present invention will now be described. In the following description of the drawings, the same or similar components are denoted by the same or similar reference numerals. The drawings are presented for illustrative purposes, and the dimensions and shape of each part are given as examples. The technical scope of the invention of the present application should not be interpreted as being limited to the embodiments described herein.

First Embodiment

Figure 2:
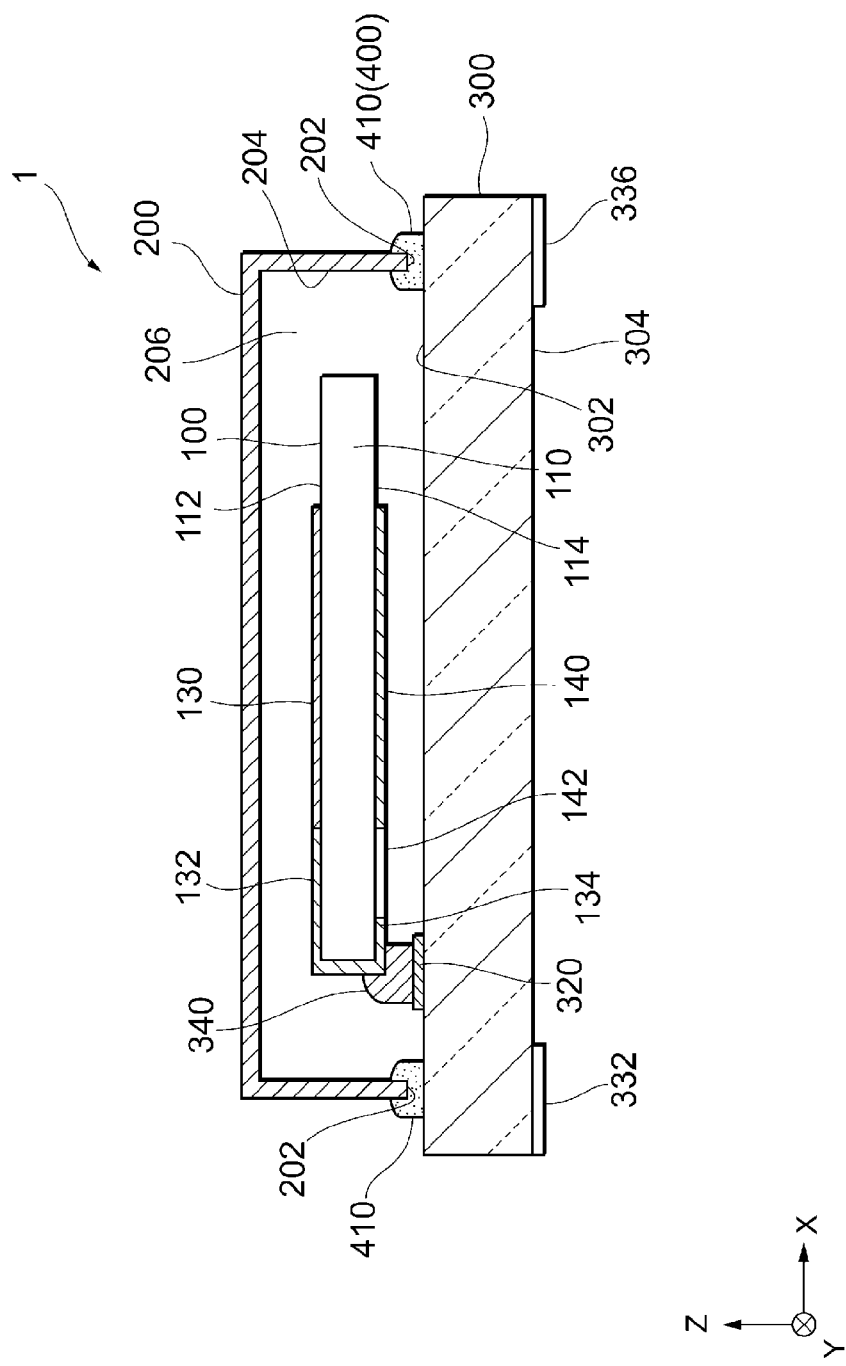
FIG. 2 is a cross-sectional view taken along line II-II of FIG. 1.
Figure 3A:
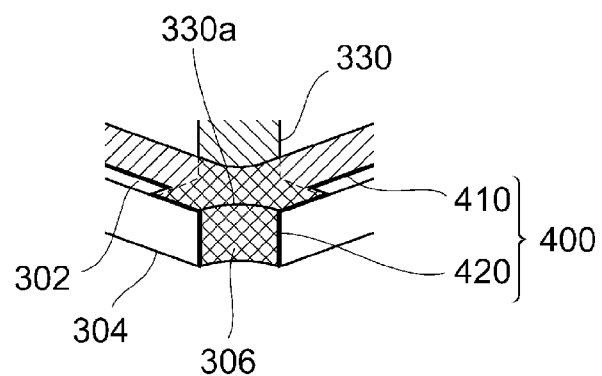
FIGS. 3A to 3C are each a partial enlarged view of the piezoelectric vibration device according to the first embodiment of the present invention.
Figure 3B:
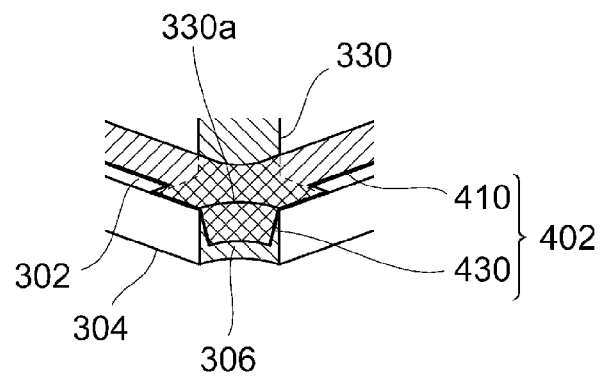
Figure 3C:
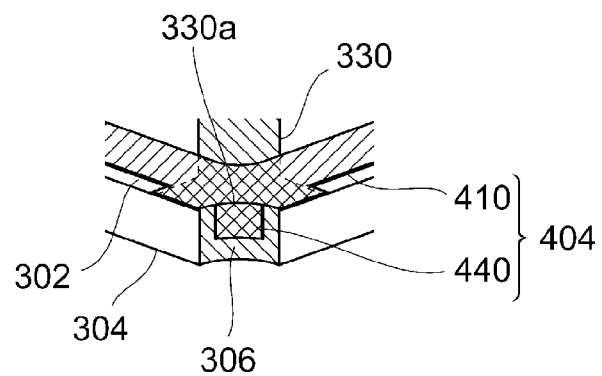
Figure 4:
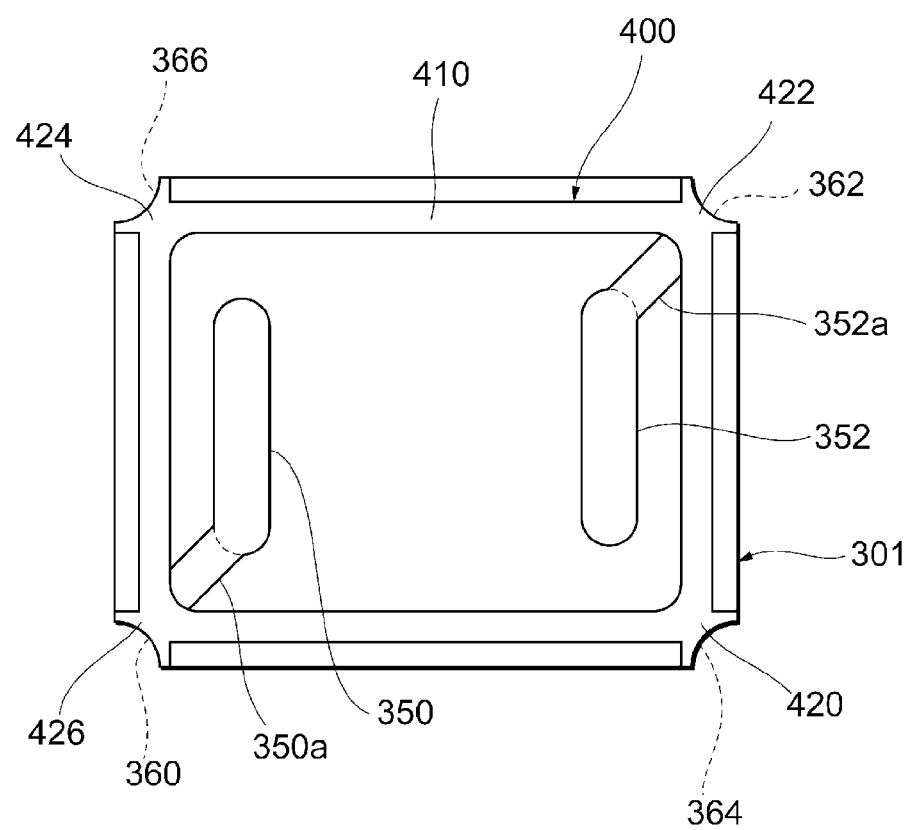
FIG. 4 illustrates a modification of the first embodiment of the present invention.

A piezoelectric vibration device according to the present embodiment will now be described with reference to FIGS. 1 to 4. FIG. 1 is an exploded perspective view of the piezoelectric vibration device according to the present embodiment. FIG. 2 is a cross-sectional view taken along line II-II of FIG. 1. FIGS. 3A to 3C are each a partial enlarged view of a base, and each illustrate a detailed configuration of a covering member according to the present embodiment. FIG. 4 illustrates a modified base.

As illustrated in FIG. 1, a piezoelectric vibration device 1 according to the present embodiment includes a piezoelectric vibrator 100, a lid 200, and a base 300. The lid 200 and the base 300 form a case or package for storing the piezoelectric vibrator 100. The piezoelectric vibrator 100, the lid 200, and the base 300 have substantially the same dimensions and shape in XY plan view. For example, the piezoelectric vibrator 100, the lid 200, and the base 300 have a substantially rectangular outer shape with a long-side (longitudinal) direction parallel to the X direction and a short-side direction parallel to the Y direction.

As illustrated in FIG. 2, the piezoelectric vibrator 100 includes a piezoelectric substrate 110, and a pair of first and second excitation electrodes 130 and 140 formed on the piezoelectric substrate 110. Specifically, the first excitation electrode 130 is formed on a first surface 112 of the piezoelectric substrate 110, and the second excitation electrode 140 is formed on a second surface 114 of the piezoelectric substrate 110.

The piezoelectric substrate 110 is made of a given piezoelectric material. The material is not particularly limited, but may be, for example, quartz crystal or AT-cut quartz crystal. The piezoelectric vibrator 100 using AT-cut quartz crystal has very high frequency stability over a wide temperature range, has good aging characteristics, and can be manufactured at low cost. The piezoelectric vibrator 100 made of AT-cut quartz crystal often uses a thickness shear mode as a main vibration mode. A quartz crystal material other than AT-cut quartz crystal may be used as the piezoelectric material. Another piezoelectric material, such as ceramic, may be used instead of quartz crystal.

The first and second excitation electrodes 130 and 140, which form a pair of electrodes, on the piezoelectric substrate 110 are arranged to substantially entirely overlap in XY plan view. An extended electrode 132 electrically connected to the first excitation electrode 130 is formed on the first surface 112 of the piezoelectric substrate 110. The extended electrode 132 extends toward the negative side of the X axis along the longitudinal direction of the piezoelectric substrate 110, passes through a side face of the piezoelectric substrate 110, and is electrically connected to a connection electrode 134 formed on the second surface 114 opposite the first surface 112. An extended electrode 142 electrically connected to the second excitation electrode 140 is formed on the second surface 114 of the piezoelectric substrate 110 (see FIG. 2). The extended electrode 142 extends toward the negative side of the X axis along the longitudinal direction of the piezoelectric substrate 110, and is electrically connected to a connection electrode 144 formed on the second surface 114. The connection electrodes 134 and 144 thus electrically connected to the first and second excitation electrodes 130 and 140, respectively, are arranged at the same end (i.e., on the same short side) of the second surface 114 of the piezoelectric substrate 110 in the longitudinal direction.

The arrangement of the connection electrodes 134 and 144 are not limited to that described above, and may be appropriately changed by taking into account the electrical connection with other components.

The above-described electrodes, including the first and second excitation electrodes 130 and 140, may each be composed of a chromium (Cr) layer serving as a base layer and a gold (Au) layer formed on the surface of the chromium layer, but the materials of the electrodes are not limited to this.

The lid 200 has a recess 204 that opens to face a first surface 302 of the base 300. Also, the lid 200 has an opening edge portion 202 of the recess 204. The lid 200 may be made of a metal material, an insulating material, or a composite of both. The outer shape of the lid 200, the shape of the recess 204, and the form of the opening edge portion 202 are not limited. For example, the opening edge portion may be a flange that protrudes from the opening edge in the direction from the center of the opening of the recess toward the opening edge.

The base 300 is substantially rectangular in outer shape, and has the piezoelectric vibrator 100 on the first surface 302. The base 300 may be made of ceramic. As illustrated in FIG. 2, by joining the lid 200 and the base 300 together, the piezoelectric vibrator 100 is hermetically sealed in an internal space (cavity) 206 surrounded by the recess 204 of the lid 200 and the base 300. In the present embodiment, the lid 200 and the base 300 are joined together by a covering member 400 made of, for example, a glass material. In the example illustrated in FIG. 2, the piezoelectric vibrator 100 is supported by the lid 200 and the base 300 such that one end thereof where the connection electrodes 134 and 144 are arranged is a fixed end, and the other end of the piezoelectric vibrator 100 is a free end.

As illustrated in FIG. 1, the base 300 has outer electrodes 330, 332, 334, and 336 formed at the respective corner portions thereof. The outer electrodes 330, 332, 334, and 336 each are formed to continuously extend from the first surface 302 onto which the piezoelectric vibrator 100 is to be mounted, through a side face 306 of the base 300, to the second surface 304 of the base 300. In the example illustrated in FIG. 1, the base 300 has the side face 306 (notched side face) formed by cutting part of each corner portion of the base 300 into a cylindrically curved shape (or castellated shape). The outer electrodes 330, 332, 334, and 336 each are formed to continuously extend from the first surface 302 onto which the piezoelectric vibrator 100 is to be mounted, through the side face 306 formed by cutting each of the corner portions into a cylindrically curved shape as described above, to the second surface 304 of the base 300. The shape of the corner portions of the base 300 is not limited to that described above. For example, each corner portion may be cut into a planar face (cut-away side face), or the edge of each corner portion may be left uncut.

In the example illustrated in FIG. 1, the outer electrode 330, which is one of the outer electrodes 330, 332, 334, and 336, is electrically connected through an extended electrode 320a to a connection electrode 320 formed on the first surface 302, and the outer electrode 332, which is another of the outer electrodes 330, 332, 334, and 336, is electrically connected through an extended electrode 322a to a connection electrode 322 formed on the first surface 302. The remaining two outer electrodes 334 and 336 are formed as dummy electrodes which are not electrically connected to either of the connection electrodes described above. The connection electrode 320 on the base 300 is electrically connected to the connection electrode 134 on the piezoelectric vibrator 100, with a conductive retainer 340 interposed therebetween. Similarly, the connection electrode 322 on the base 300 is electrically connected to the connection electrode 144 on the piezoelectric vibrator 100, with a conductive retainer 342 interposed therebetween. The two outer electrodes 330 and 332 electrically connected to the piezoelectric vibrator 100 as described above may be at opposite locations (i.e., on a diagonal line of the rectangle) in the XY plane.

Note that the numbers, arrangements, and pattern shapes of the connection electrodes and the outer electrodes are not particularly limited. For example, in the example illustrated in FIG. 1, the connection electrodes 320 and 322 on the base 300 are arranged on the same short side of the base 300. This may be modified, as illustrated in FIG. 4, such that connection electrodes 350 and 352 are arranged on different short sides opposite each other. More specifically, in the example illustrated in FIG. 4, a base 301 has outer electrodes 360, 362, 364, and 366 formed at the respective corner portions thereof. The outer electrode 360, which is one of the outer electrodes 360, 362, 364, and 366, is electrically connected through an extended electrode 350a to the connection electrode 350 formed on a first surface of the base 301, and the outer electrode 362, which is another of the outer electrodes 360, 362, 364, and 366, is electrically connected through an extended electrode 352a to the connection electrode 352 formed on the first surface. The remaining two outer electrodes 364 and 366 are formed as dummy electrodes which are not electrically connected to either of the connection electrodes described above. The connection electrodes 350 and 352 may be formed in an elongated shape along the short sides of the base 301. In this configuration, the piezoelectric vibrator is supported by the base 301 at both ends thereof in the longitudinal direction.

The outer electrodes 330, 332, 334, and 336 formed on the base 300 thus provide an electrical connection from the first surface 302, which has the piezoelectric vibrator 100 mounted thereon, to the second surface 304, which is a mounting side of the piezoelectric vibration device 1.

In the piezoelectric vibration device 1 configured as described above, an alternating voltage is applied between the first and second excitation electrodes 130 and 140 on the piezoelectric vibrator 100 through the outer electrodes 330 and 332. This causes the piezoelectric substrate 110 to vibrate in thickness shear mode, and provides resonance characteristics of the vibration.

In the present embodiment, an edge portion of one of the outer electrodes, formed by the first surface 302 and the side face 306 of the base 300, is at least partly covered by a covering member having insulating properties. The covering member of the present embodiment is for hermetically sealing the piezoelectric vibrator 100.

As illustrated in FIGS. 1 and 2, the covering member 400 has a frame-shaped sealing portion 410, and a plurality of extended portions 420, 422, 424, and 426 extending from the frame-shaped sealing portion 410. The frame-shaped sealing portion 410 is integrally disposed on the first surface 302 of the base 300 along the opening edge portion 202 of the lid 200, and provides hermetic sealing between the opening edge portion 202 of the lid 200 and the first surface 302 of the base 300. One of the extended portions 420, 422, 424, and 426 is integrally formed with the frame-shaped sealing portion 410, and covers at least part of an edge portion of a corresponding one of the outer electrodes 330, 332, 334, and 336.

In the example illustrated in FIG. 3A, the extended portion 420 continuously extends from the frame-shaped sealing portion 410 through the first surface 302 and the side face 306 to the second surface 304, so as to cover an entire edge portion 330a of the outer electrode 330 formed by the first surface 302 and the side face 306. The extended portion 420 is formed along the side face 306 to reach the second surface 304. In this case, the extended portion 420 may cover the entire side face 306, which is a notched portion. This improves adhesion strength between the covering member 400 and the base 300. The configuration of this extended portion may be applied to the other extended portions 422, 424, and 426 illustrated in FIG. 1.

The covering member 400 may be made of a glass material, such as low-melting glass (e.g., lead-borate glass or tin-phosphate glass) or glass dried at low temperatures (e.g., alumina or silica). Using the covering member 400 (including the frame-shaped sealing portion 410 and the extended portions 420, 422, 424, and 426) made of glass improves adhesion strength with a base substrate of ceramic or the like.

The covering member 400 may be made of an insulating resin material. The resin material may be thermosetting resin, or an epoxy based adhesive agent mainly composed of epoxy resin.

The configuration of the extended portion of the covering member 400 is not limited to that illustrated in FIG. 3A. FIGS. 3B and 3C each illustrate a modification of the covering member described above, and modified parts in each drawing are denoted by different reference numerals.

As in the modification illustrated in FIG. 3B, a covering member 402 may have an extended portion 430 extending from the frame-shaped sealing portion 410. The extended portion 430 may extend along the side face 306 to a position between the first surface 302 and the second surface 304, and the side face 306 may have a stepped portion formed by the thickness of the extended portion 430. With this stepped portion on the side face 306 of the base 300, for example, even when a solder material is applied onto the second surface 304 of the base 300, the stepped portion formed by the extended portion 430 serves as a stopper to prevent solder wicking during a reflow process. This prevents an electrical short circuit with the lid 200 made of, for example, a metal material. When the covering member 402 is made of a resin material or a glass material, the covering member 402 is not wetted by solder and solder wicking is further prevented.

As in the modification illustrated in FIG. 3C, a covering member 404 may have an extended portion 440 extending from the frame-shaped sealing portion 410. The extended portion 440 may cover part of the edge portion 330a of the outer electrode 330 formed by the first surface 302 and the side face 306. This prevents disconnection of the outer electrode 330 at the portion covered by the covering member 404 (extended portion 440).

In the piezoelectric vibration device 1 according to the present embodiment, the edge portion 330a of the outer electrode 330, formed by the first surface 302 and the side face 306 of the base 300, is at least partly covered by the covering member 400. This reduces exposure of the electrode at the edge portion, prevents disconnection of the electrode, and thus improves reliability of electrical connection.

A method for manufacturing a piezoelectric vibration device according to the present embodiment will now be described with reference to FIG. 5.

Figure 5:
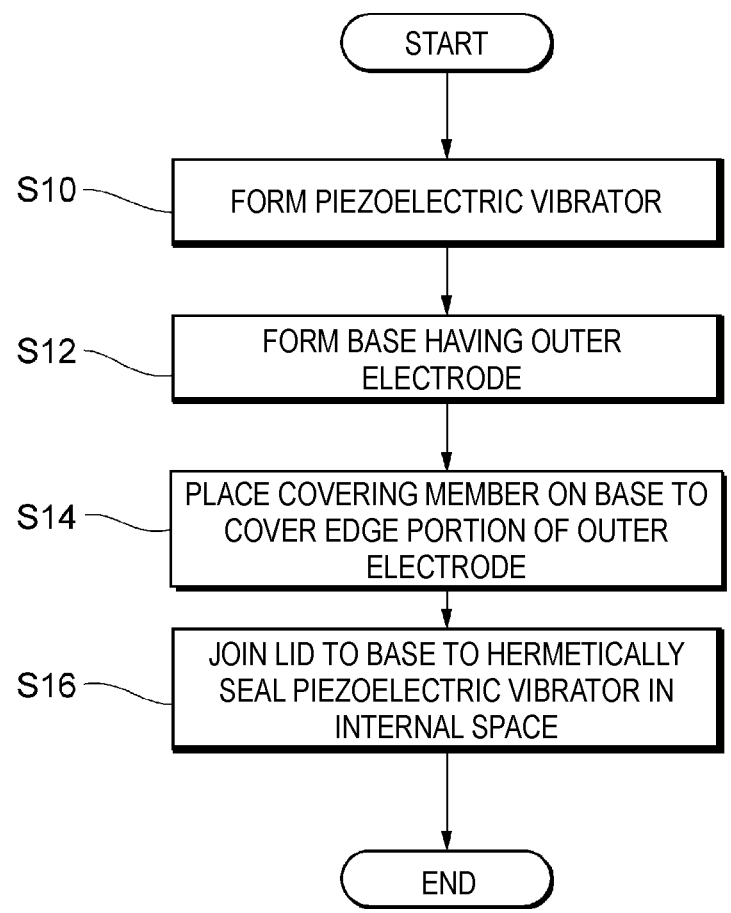
FIG. 5 illustrates a method for manufacturing the piezoelectric vibration device according to the first embodiment of the present invention.

First, the piezoelectric vibrator 100 is formed as in FIG. 5 (S10 in FIG. 5). To form a quartz crystal as the piezoelectric vibrator 100, first, a wafer of quartz crystal is cut out at predetermined cut angles from a raw synthetic quartz crystal or natural quartz crystal. The wafer is then cut with a dicing machine or etched into a predetermined rectangular outer shape, and subjected to sputtering, vacuum deposition, or the like to form various electrodes including the first and second excitation electrodes 130 and 140 thereon (see FIG. 1).

Next, the base 300 having various electrodes, including the outer electrodes 330, 332, 334, and 336, are formed (S12 in FIG. 5). Specifically, the electrodes of metal, such as silver, silver palladium alloy, molybdenum, or tungsten, are formed by application of an electrode paste and firing. The various electrodes, including the outer electrodes 330, 332, 334, and 336, may be formed by sputtering, vacuum deposition, or the like.

Next, the covering member 400 is placed on the base 300, and the edge portion 330a of the outer electrode 330 is covered by the covering member 400 (e.g., extended portion 420) (see S14 in FIG. 5 and FIG. 3A). Then, the lid 200 is joined to the base 300 to hermetically seal the piezoelectric vibrator 100 in the internal space 206 (see S16 in FIG. 5 and FIG. 2). For example, when the covering member 400 is made of glass, the covering member 400 of glass is placed on the base 300 and subjected to preliminary firing. Then after the lid 200 is mounted onto the base 300, with the frame-shaped sealing portion 410 of the covering member 400 interposed therebetween, the covering member 400 is subjected to final firing. The final firing is done at a temperature higher than that in the preliminary firing. The preliminary firing is not necessarily required, and may be performed where appropriate. Thus, the frame-shaped sealing portion 410 of the covering member 400 finally provides hermetic sealing between the opening edge portion 202 of the lid 200 and the first surface 302 of the base 300. In any of the steps described above, frequency adjustment may be made, as necessary, by applying a light beam to a metal covering portion (e.g., first excitation electrode 130) for frequency adjustment on the surface of the piezoelectric vibrator 100.

The frame-shaped sealing portion 410 and the extended portion 420 may be formed as separate components. The frame-shaped sealing portion 410 may be formed, for example, by applying a glass material to the base 300, or by applying or transferring a glass material to the opening edge portion 202 of the lid 200 in advance and mounting the lid 200 onto the base 300 while transferring the glass material thereto.

The piezoelectric vibrator 100 may be mounted onto the base 300 in any step before the lid 200 is hermetically sealed (e.g., before the covering member is placed on the base 300). The step specifically involves, for example, applying the conductive retainers 340 and 342 to the connection electrodes 320 and 322, respectively, on the base 300, mounting the piezoelectric vibrator 100 onto the base 300, connecting the conductive retainers 340 and 342 to the connection electrodes 134 and 144, respectively, on the piezoelectric vibrator 100, and curing the conductive retainers 340 and 342.

The method for manufacturing the piezoelectric vibration device according to the present embodiment may include preparing a collective board, which is a collection of a plurality of bases 300, and performing each of the steps described above on the bases 300. The collective board is eventually cut into pieces by a dicing machine.

In the method for manufacturing the piezoelectric vibration device 1 according to the present embodiment, the edge portion 330a of the outer electrode 330, formed by the first surface 302 and the side face 306 of the base 300, is at least partly covered by the covering member 400. This reduces exposure of the electrode at the edge portion, prevents disconnection of the electrode, and thus improves reliability of electrical connection.

Second Embodiment

A piezoelectric vibration device according to the present embodiment will now be described with reference to FIGS. 6 and 7. In the following embodiments, differences from the first embodiment will be described, and previously discussed matters will not be repeated.

A piezoelectric vibration device 3 according to the present embodiment includes a sealing member 500 for hermetically sealing the piezoelectric vibrator 100. A covering member 406 according to the present embodiment is for guiding the sealing member 500.

Figure 7:
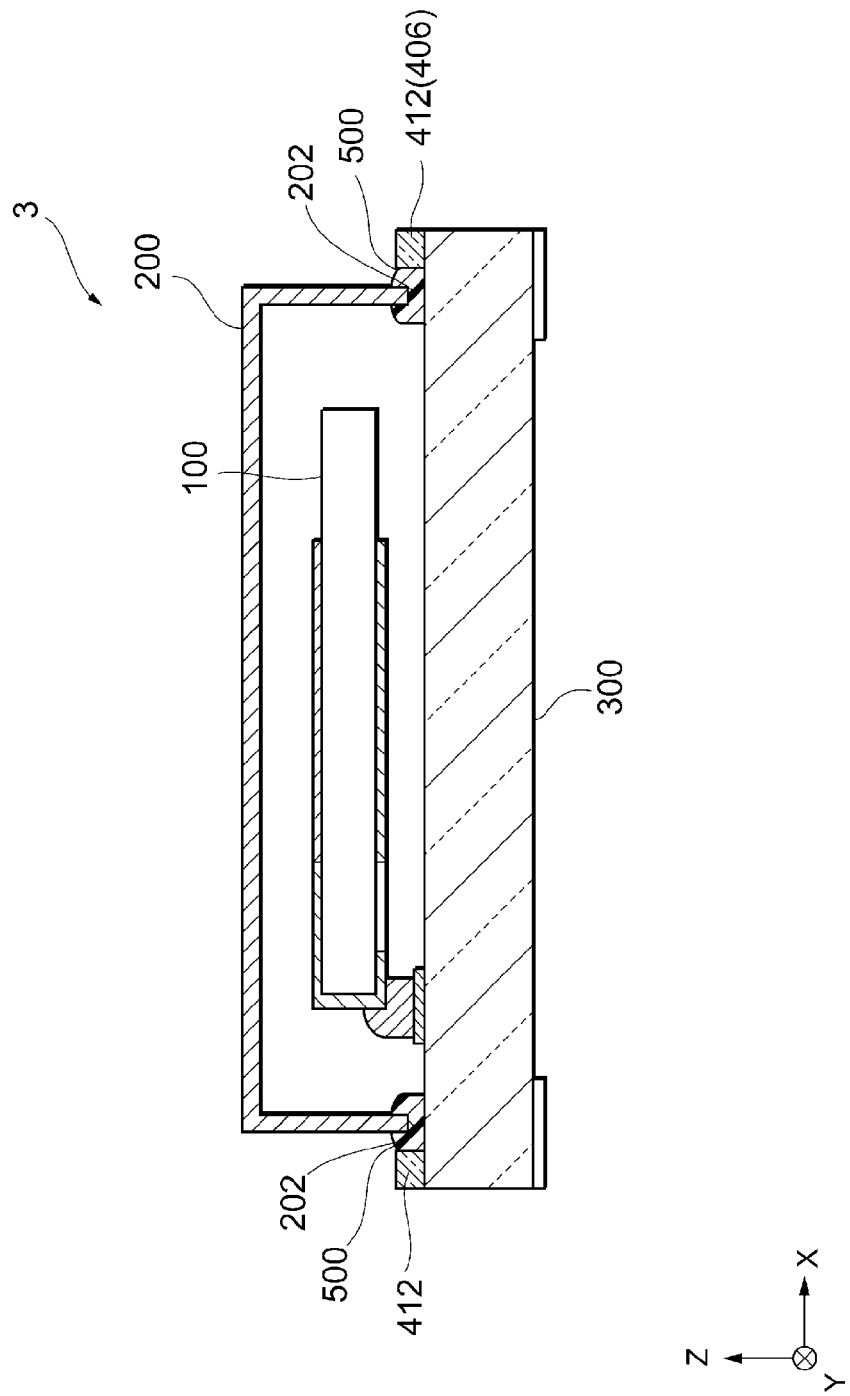
FIG. 7 is a cross-sectional view taken along line VII-VII of FIG. 6.

Specifically, as illustrated in FIGS. 6 and 7, the covering member 406 has a frame-shaped guide portion 412, and a plurality of extended portions 450, 452, 454, and 456 extending from the frame-shaped guide portion 412.

The frame-shaped guide portion 412 is integrally disposed on the first surface 302 of the base 300 along the opening edge portion 202 of the lid 200. The frame-shaped guide portion 412 is disposed to surround the sealing member 500 to be slightly larger in outer shape than the opening edge portion 202. The sealing member 500 is made of, for example, an insulating resin material. The resin material may be thermosetting resin, such as an epoxy based adhesive agent. With the frame-shaped guide portion 412, the sealing member 500 is guided within the range of the frame-shaped guide portion 412 and prevented from moving to the outside of the base 300 during and after the process of its manufacture. One of the extended portions 450, 452, 454, and 456 is integrally formed with the frame-shaped guide portion 412 and covers at least part of the edge portion of the corresponding outer electrode.

The method for manufacturing the piezoelectric vibrator according to the present embodiment is the same as that described in the first embodiment, except that the lid 200 and the base 300 are joined together, with the sealing member 500 interposed therebetween. The sealing member 500 may be placed on the opening edge portion 202 of the lid 200, or may be placed along the inside of the frame-shaped guide portion 412 of the covering member 406 after the covering member 406 is placed on the base 300 (e.g., after the covering member 406 of glass is subjected to final firing).

The other configurations of the present embodiment are the same as those already described.

Third Embodiment

A piezoelectric vibration device according to the present embodiment will now be described with reference to FIGS. 8 and 9. A piezoelectric vibration device 5 according to the present embodiment differs from the piezoelectric vibration device 1 of the embodiment described above in that the piezoelectric vibration device 5 further includes a sealing member 510 on the frame-shaped sealing portion 410 of the covering member 400.

Figure 9:
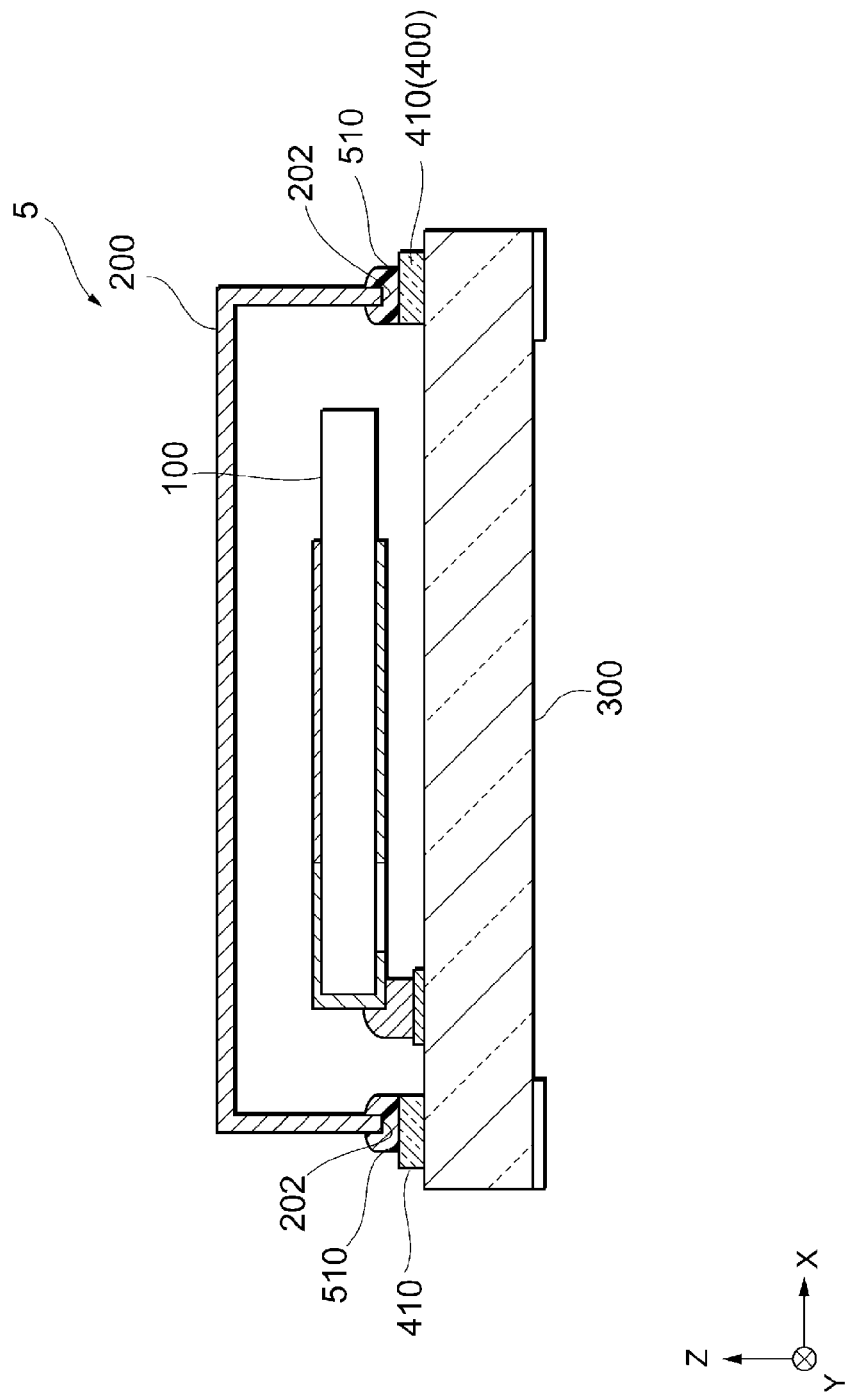
FIG. 9 is a cross-sectional view taken along line IX-IX of FIG. 8.

Specifically, as illustrated in FIGS. 8 and 9, the sealing member 510 is made of, for example, an insulating resin material. The resin material may be thermosetting resin, such as an epoxy based adhesive agent. Like the frame-shaped sealing portion 410 of the covering member 400, the sealing member 510 is integrally disposed on the first surface of the base 300 along the opening edge portion 202 of the lid 200, and provides hermetic sealing between the opening edge portion 202 of the lid 200 and the first surface of the base 300. In the present embodiment, the covering member 400 is preferably made of a glass material. For example, low-melting glass may be used to form the covering member 400. Since a component obtained by curing the sealing member 510 of resin has an elastic modulus lower than that of glass, stress applied to the glass after the resin is cured is reduced. This improves adhesion strength between the covering member 400 of glass and the base 300 of ceramic or the like. Since a component obtained by curing the sealing member 510 of resin has a higher joining strength with a metal material than with glass, a joining strength with the lid is high when the lid 200 is made of a metal material.

The method for manufacturing the piezoelectric vibrator according to the present embodiment is the same as that described in the first embodiment, except that the lid 200 and the base 300 are joined together, with the sealing member 510 and the covering member 400 interposed therebetween. For example, the sealing member 510 and the covering member 400 may be formed as follows. That is, after the covering member 400 of glass is placed on the base 300, the covering member 400 is subjected to final firing. Then, a sealing member of resin is formed on at least one of the frame-shaped sealing portion 410 of the covering member 400 and the opening edge portion 202 of the recess of the lid 200. After the lid 200 is mounted onto the base 300, with the sealing member and the frame-shaped sealing portion 410 interposed therebetween, the sealing member 510 of resin is thermally cured.

The other configurations of the present embodiment are the same as those already described.

Fourth Embodiment

A piezoelectric vibration device according to the present embodiment will now be described with reference to FIGS. 10 and 11. In the embodiments described above, an outer electrode formed at each corner portion of the base is covered with a covering member. As described below, however, an outer electrode formed on any side face of the base, except for the corner portions, may be covered with a covering member. Note that the piezoelectric vibrator and the lid are not shown in FIGS. 10 and 11.

Figure 10:
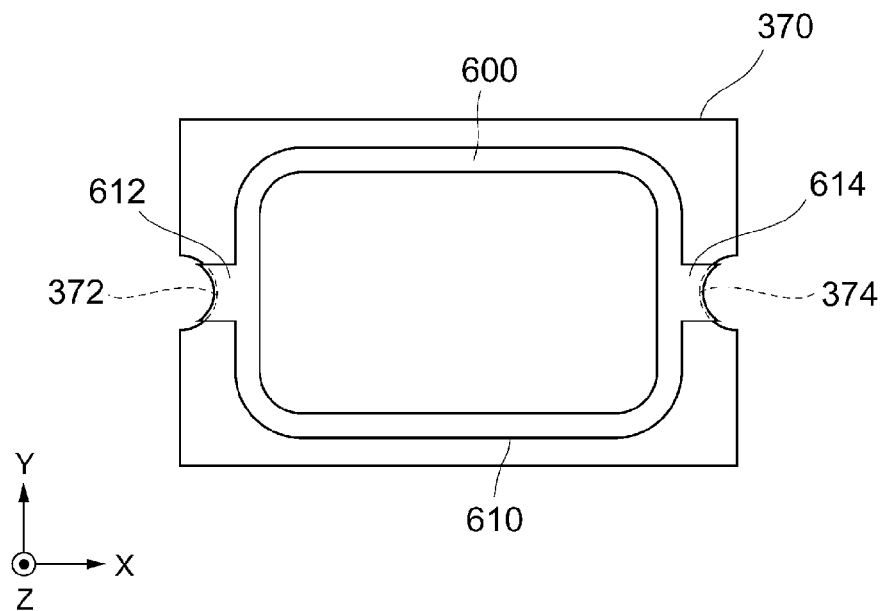
FIG. 10 is a plan view of a piezoelectric vibration device according to a fourth embodiment of the present invention.

As illustrated in FIG. 10, two opposite sides of a base 370 substantially rectangular in outer shape have, for example, respective cylindrically notched side faces. Outer electrodes 372 and 374 are each formed to extend from a first surface of the base 370 onto which the piezoelectric vibrator is to be mounted, through a corresponding one of the notched side faces, to a second surface opposite the first surface. This embodiment provides a two-terminal structure having two outer electrodes. A covering member 600 has a frame-shaped sealing portion 610, and a plurality of extended portions 612 and 614 extending from the frame-shaped sealing portion 610. The extended portion 612 is configured to cover the outer electrode 372 corresponding thereto, and the extended portion 614 is configured to cover the outer electrode 374 corresponding thereto. The outer electrodes 372 and 374 may each be located at substantially the center of the corresponding side, or may be displaced from the center toward either of the corner portions. In either case, the edge portion of each outer electrode, formed by the first surface and the notched side face of the base 370, is at least partly covered by the extended portion disposed to correspond to the outer electrode.

Figure 11:
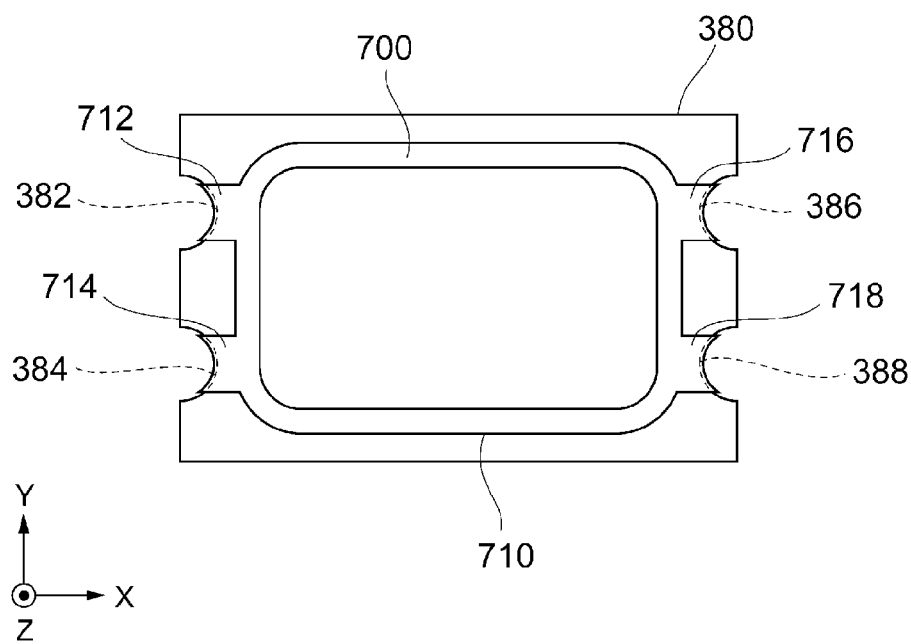
FIG. 11 illustrates a modification of the fourth embodiment of the present invention.

Alternatively, as in a modification illustrated in FIG. 11, two opposite sides of a base 380 substantially rectangular in outer shape may each have, for example, two cylindrically notched side faces. Outer electrodes 382, 384, 386, and 388 may each be formed to extend from a first surface of the base 380 onto which the piezoelectric vibrator is to be mounted, through a corresponding one of the notched side faces, to a second surface opposite the first surface. In this case, a covering member 700 has a frame-shaped sealing portion 710, and a plurality of extended portions 712, 714, 716, and 718 extending from the frame-shaped sealing portion 710. Each of the extended portions is configured to cover a corresponding one of the outer electrodes 382, 384, 386, and 388. Although this modification provides a four-terminal structure having four outer electrodes, the arrangement of the outer electrodes is not limited to the illustrated one. For example, opposite long sides of the base 380 may each have two outer electrodes, or the four sides of the base 380 may each have an outer electrode.

In the present embodiment, the positions of the outer electrodes and the covering member corresponding thereto differ from those in the configurations of the embodiments described above. The other configurations of the present embodiment may be obtained by appropriately selecting and combining some of those already described.

The embodiments described above are intended to facilitate understanding of the present invention, and are not intended to interpret the present invention in a limiting sense. The present invention can be changed or improved without departing from the spirit thereof, and includes equivalents thereof. That is, embodiments to which design changes are appropriately made by those skilled in the art are also included in the scope of the present invention, as long as they have the features of the present invention. For example, the elements of the embodiments and their arrangements, materials, conditions, shapes, and sizes are not limited to the illustrated ones and can be changed appropriately. The elements of the embodiments may be combined as long as it is technically possible, and combinations of the elements are also included in the scope of the present invention, as long as they have the features of the present invention.

REFERENCE SIGNS LIST 1, 3, 5: piezoelectric vibration device
110: piezoelectric substrate
130: first excitation electrode
140: second excitation electrode
200: lid
202: opening edge portion
204: recess
206: internal space
300, 301: base
302: first surface
304: second surface
306: side face
330, 332, 334, 336: outer electrode
330a: edge portion
400, 402, 404, 406: covering member
410: frame-shaped sealing portion
412: frame-shaped guide portion
420, 422, 424, 426: extended portion
500, 510: sealing member

The invention claimed is:

1. A piezoelectric vibration device comprising:
a piezoelectric vibrator having excitation electrodes formed thereon;
a base having a first surface, a second surface opposite the first surface, and a side face connecting the first surface and the second surface;
an outer electrode continuously extending from the first surface of the base through the side face of the base to the second surface of the base, the outer electrode having an edge portion defined by the first surface and the side face of the base;
a piezoelectric vibrator having excitation electrodes thereon, the piezoelectric vibrator opposing the first surface of the base; and
a lid having a recess that faces the first surface of the base, the lid having an opening edge portion;
a sealing member disposed between the first surface of the base and the opening edge portion of the recess and hermetically sealing the piezoelectric vibrator in an internal space between the recess and the first surface of the base; and
a covering member having insulating properties, the covering member including:
a frame-shaped guide portion formed on the first surface of the base and surrounding the sealing member, and
an extended portion integral with the frame-shaped guide portion, the extended portion extending from the frame-shaped guide portion to cover at least part of the edge portion of the outer electrode.

2. The piezoelectric vibration device according to claim 1, wherein the covering member is made of a resin material.

3. The piezoelectric vibration device according to claim 1, wherein the covering member is made of a glass material.

4. The piezoelectric vibration device according to claim 1, wherein the base has a notched side face, and the outer electrode continuously extends from the first surface of the base through the notched side face to the second surface of the base.

5. The piezoelectric vibration device according to claim 1, wherein the extended portion extends along the side face of the base to the second surface.

6. The piezoelectric vibration device according to claim 1, wherein the extended portion extends along the side face of the base to a position between the first surface and the second surface.

7. The piezoelectric vibration device according to claim 6, wherein a thickness of the extended portion forms a stepped portion along the side face.

8. The piezoelectric vibration device according to claim 1, wherein the outer electrode is a first outer electrode and the extended portion is a first extended portion, and the piezoelectric vibration device further includes at least a second outer electrode continuously extending from the first surface of the base through the side face of the base to the second surface of the base, the second outer electrode having a second edge portion defined by the first surface and the side face of the base; and a second extended portion integral with the frame-shaped guide portion, the second extended portion extending from the frame-shaped guide portion to cover at least part of the second edge portion of the second outer electrode.

9. The piezoelectric vibration device according to claim 1, wherein the entire edge portion of the outer electrode is covered by the covering member.

10. The piezoelectric vibration device according to claim 1, wherein the frame-shaped guide portion is made of glass, the extended portion is made of glass, and the sealing member is made of resin.

11. A method for manufacturing a piezoelectric vibration device, the method comprising:
forming a piezoelectric vibrator having excitation electrodes;
forming a base having an outer electrode that continuously extends from a first surface of the base through a side face of the base to a second surface of the base opposite the first surface;
providing a covering member having insulating properties, the covering member including:
    a frame-shaped sealing portion made of glass, the frame-shaped sealing portion being disposed on the first surface of the base, and
    an extended portion made of glass and integrally formed with the frame-shaped sealing portion, the extended portion extending from the frame-shaped sealing portion to cover at least part of an edge portion of the outer electrode, the edge portion being formed by the first surface and the side face of the base;
subjecting the covering member to preliminary firing after the covering member is placed on the base;
mounting the piezoelectric vibrator so as to oppose the first surface of the base; and
joining a lid having a recess opening that faces the first surface of the base to the base such that the frame-shaped sealing portion is along an opening edge portion of the recess of the lid, so as to hermetically seal the piezoelectric vibrator in an internal space defined by the recess and the base; and
subjecting the covering member to final firing after the lid is mounted on the base.

12. The method for manufacturing a piezoelectric vibration device according to claim 11, further comprising interposing a sealing member between the opening edge portion of the recess and the base such that the lid is joined to the base by the sealing member, and the frame-shaped sealing portion surrounds the sealing member.

13. The method for manufacturing a piezoelectric vibration device according to claim 11, further comprising:
forming a sealing member made of resin on at least one of the frame-shaped sealing portion of the covering member and an opening edge portion of the recess of the lid;
mounting the lid onto the base with the frame-shaped sealing portion of the covering member and the sealing member of resin interposed therebetween; and
thermally curing the sealing member.

* * * * *